US012688904B2

(12) United States Patent
Chang et al.

(10) Patent No.: US 12,688,904 B2
(45) Date of Patent: ***Jul. 21, 2026

(54) ADAPTIVE ERROR AVOIDANCE IN THE MEMORY DEVICES

(71) Applicant: Micron Technology, Inc., Boise, ID (US)

(72) Inventors: Li-Te Chang, San Jose, CA (US); Yu-Chung Lien, San Jose, CA (US); Murong Lang, San Jose, CA (US); Zhenming Zhou, San Jose, CA (US); Michael G. Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

This patent is subject to a terminal disclaimer.

(21) Appl. No.: 18/771,393

(22) Filed: Jul. 12, 2024

(65) Prior Publication Data

US 2024/0363190 A1 Oct. 31, 2024

Related U.S. Application Data

(63) Continuation of application No. 17/894,528, filed on Aug. 24, 2022, now Pat. No. 12,073,905.

(51) Int. Cl.
*G11C 29/52* (2006.01)
*G11C 16/08* (2006.01)
(Continued)

(52) U.S. Cl.
CPC .............. *G11C 29/52* (2013.01); *G11C 16/08* (2013.01); *G11C 16/102* (2013.01); *G11C 16/3404* (2013.01)

(58) Field of Classification Search
CPC ....... G11C 29/52; G11C 16/08; G11C 16/102; G11C 16/3404; G11C 16/26;
(Continued)

(56) References Cited

U.S. PATENT DOCUMENTS 5,615,165 A * 3/1997 Tanaka ................. G11C 16/344
365/230.01
12,073,905 B2 * 8/2024 Chang .................... G11C 16/08
(Continued)

FOREIGN PATENT DOCUMENTS

CN 111383703 A 7/2020

*Primary Examiner* — Fernando Hidalgo
(74) *Attorney, Agent, or Firm* — Lowenstein Sandler LLP

(57) ABSTRACT

An example method of performing memory access operations comprises: receiving a request to perform a memory access operation; identifying a block family associated with a set of memory cells; determining, for each logical programming level of a plurality of logical programming levels, a corresponding default block family error avoidance (BFEA) threshold voltage offset value associated with the block family; determining a value of a data state metric associated with the set of memory cells; determining, for each logical programming level of a plurality of logical programming levels, a corresponding sub-BFEA threshold voltage offset value; and performing the memory access operation by applying, for each logical programming level of the plurality of logical programming levels, a combination of the default BFEA threshold voltage value, the sub-BFEA threshold voltage value, and a corresponding base voltage level.

20 Claims, 9 Drawing Sheets

(51) Int. Cl.
    *G11C 16/10*       (2006.01)
    *G11C 16/34*       (2006.01)
(58) Field of Classification Search
    CPC .............. G11C 16/349; G11C 11/5642; G11C
             16/0483; G11C 29/021; G11C 29/028
    USPC ..................................................... 365/185.09
    See application file for complete search history.

(56)                 References Cited

U.S. PATENT DOCUMENTS

| | | |
|---|---|---|
| 2015/0220388 A1 | 8/2015 | Wu et al. |
| 2016/0203863 A1 | 7/2016 | Chien et al. |
| 2023/0168811 A1 | 6/2023 | Okada |
| 2023/0246741 A1 | 8/2023 | Wu et al. |
| 2023/0376223 A1 | 11/2023 | Masuo |
| 2023/0402071 A1 | 12/2023 | Park |

* cited by examiner

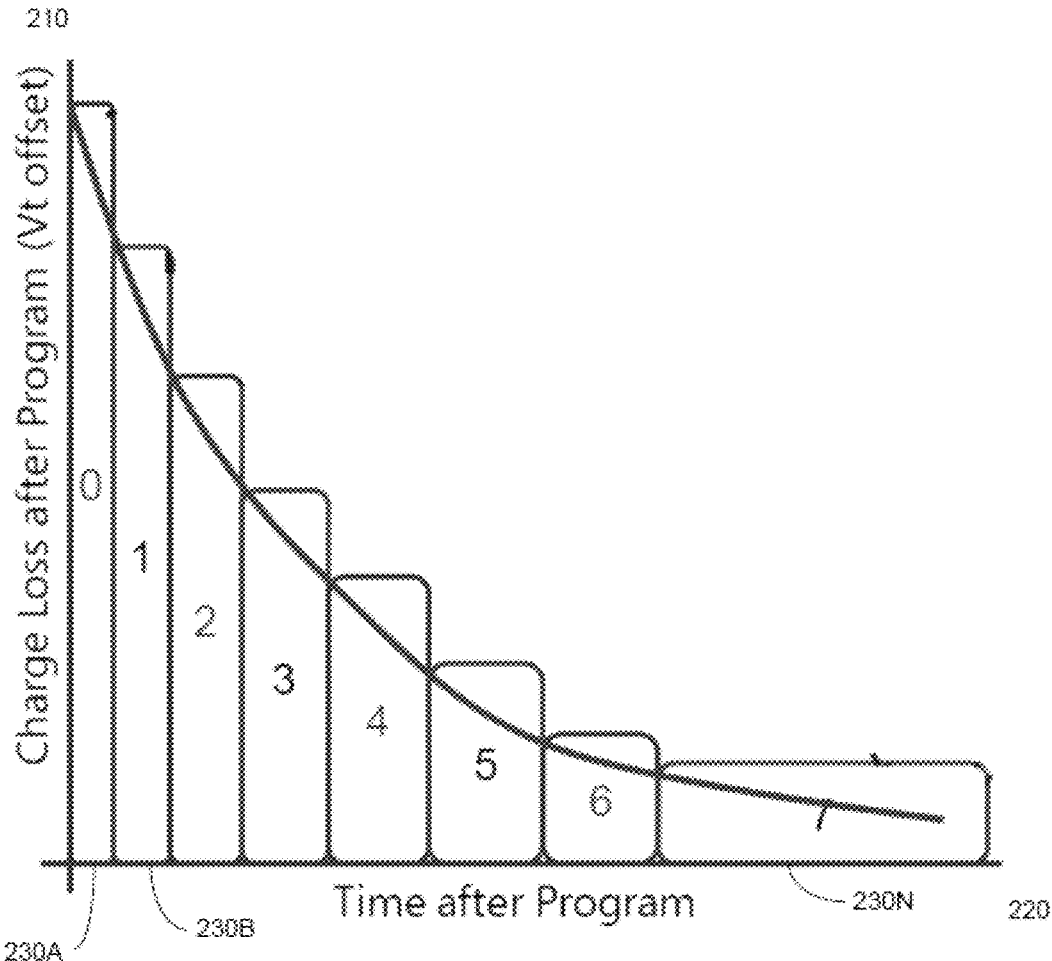
FIG. 2

610

| Bin # | 1 | 2 | 3 | 4 | 5 | 6 | 7 |
|---|---|---|---|---|---|---|---|
| Threshold Voltage Level 620A | 0 | 0 | 2 | 0 | 0 | 4 | 5 |
| Threshold Voltage Level 620B | -1 | -2 | -2 | -3 | -4 | -4 | -5 |
| Threshold Voltage Level 620C | -2 | -4 | -4 | -6 | -8 | -8 | -9 |
| Threshold Voltage Level 620D | -2 | -4 | -6 | -6 | -8 | -11 | -13 |
| Threshold Voltage Level 620E | -3 | -6 | -7 | -9 | -12 | -14 | -17 |
| Threshold Voltage Level 620F | -4 | -8 | -10 | -12 | -16 | -20 | -23 |
| Threshold Voltage Level 620G | -6 | -12 | -15 | -18 | -24 | -30 | -36 |

FIG. 6A

650

| Bin # | 1 | 2 | 3 | 4 | 5 | 6 | 7 |
|---|---|---|---|---|---|---|---|
| Threshold Voltage Level 660A | -2 | -2 | -3 | -3 | -4 | -5 | -6 |
| Threshold Voltage Level 660B | -2 | -2 | -2 | -3 | -4 | -5 | -6 |
| Threshold Voltage Level 660C | -2 | -2 | -3 | -3 | -4 | -4 | -5 |
| Threshold Voltage Level 660D | -2 | -2 | -3 | -3 | -4 | -4 | -5 |
| Threshold Voltage Level 660E | -2 | -2 | -3 | -3 | -4 | -5 | -6 |
| Threshold Voltage Level 660F | -3 | -3 | -4 | -5 | -6 | -7 | -8 |
| Threshold Voltage Level 660G | -3 | -3 | -4 | -4 | -5 | -6 | -7 |

FIG. 6B

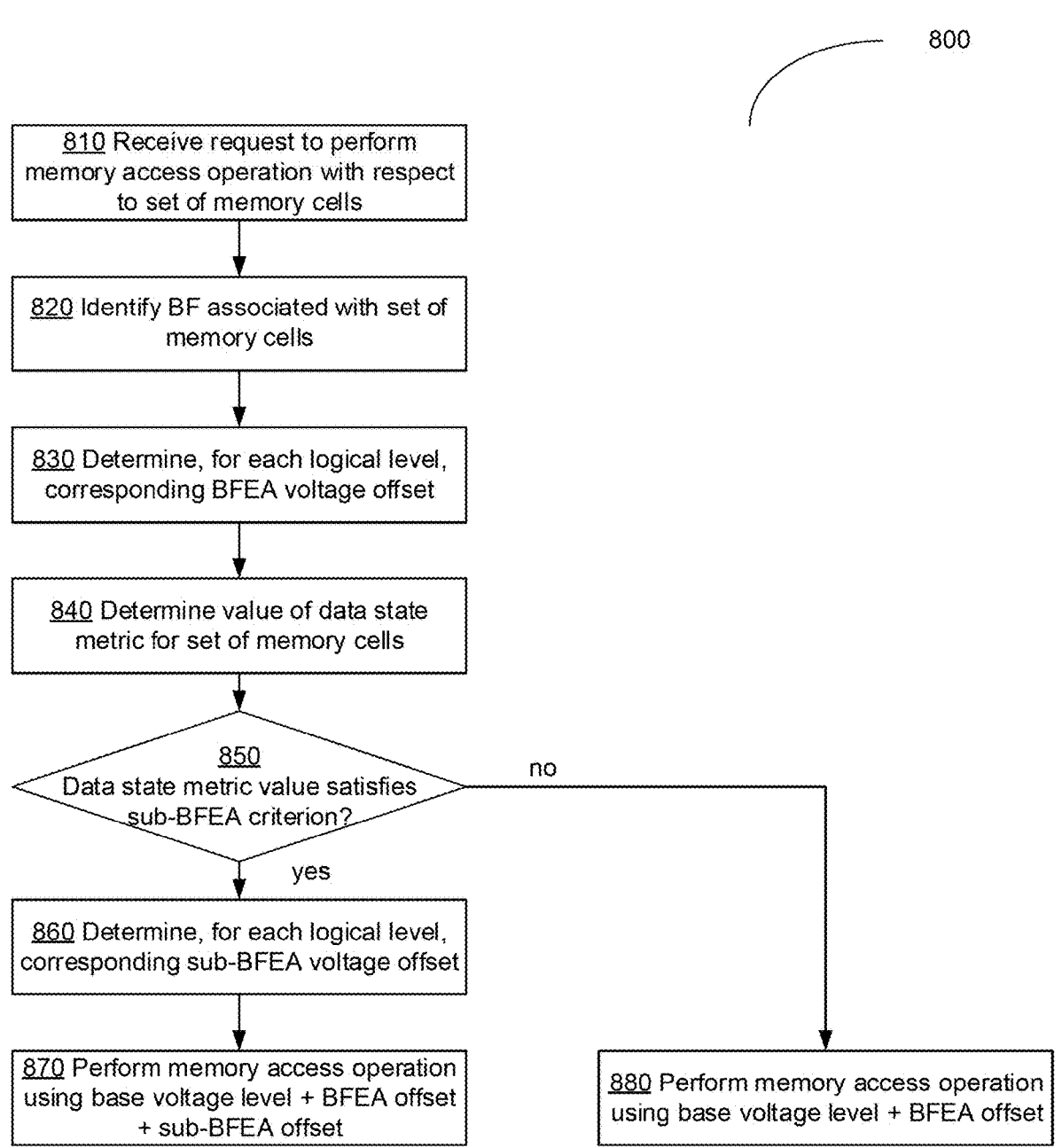

800

810 Receive request to perform memory access operation with respect to set of memory cells 820 Identify BF associated with set of memory cells 830 Determine, for each logical level, corresponding BFEA voltage offset 840 Determine value of data state metric for set of memory cells 850 Data state metric value satisfies sub-BFEA criterion?

no yes

860 Determine, for each logical level, corresponding sub-BFEA voltage offset

870 Perform memory access operation using base voltage level + BFEA offset + sub-BFEA offset 880 Perform memory access operation using base voltage level + BFEA offset

FIG. 8

ADAPTIVE ERROR AVOIDANCE IN THE MEMORY DEVICES

RELATED APPLICATIONS

This application is a continuation application of U.S. patent application Ser. No. 17/894,528, filed Aug. 24, 2022, entitled "ADAPTIVE ERROR AVOIDANCE IN THE MEMORY DEVICES", the contents of which are incorporated by reference in their entirety herein.

TECHNICAL FIELD

Embodiments of the disclosure relate generally to memory sub-systems, and more specifically, relate to adaptive error avoidance in the memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 2 depicts an example graph illustrating the dependency of the threshold voltage offset on the time after program (i.e., the period of time elapsed since the block had been programmed, in accordance with some embodiments of the present disclosure.

FIG. 6A illustrates a default table maintained by the memory sub-system controller for adaptive error avoidance, in accordance with embodiments of the present disclosure.

FIG. 6B illustrates a sub-BFEA table of a plurality of sub-BFEA tables maintained by the memory sub-system controller for adaptive error avoidance, in accordance with embodiments of the present disclosure.

FIG. 8 a flow diagram of another example method of performing a memory access operation on a memory device using adaptive block family-based error avoidance, in accordance with some embodiments of the present disclosure.

DETAILED DESCRIPTION

Figure 1:
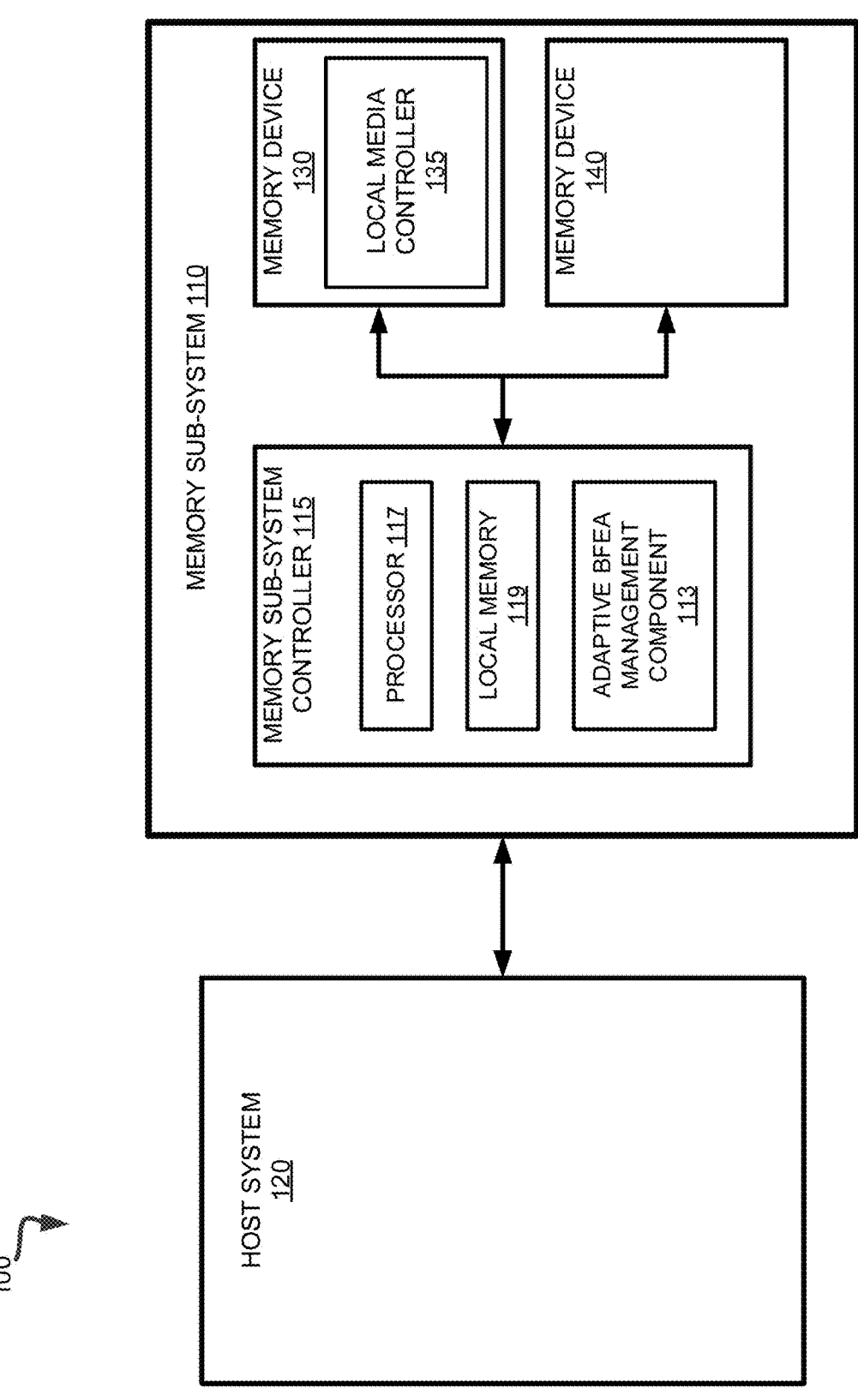
FIG. 1 illustrates an example computing system that includes a memory sub-system in accordance with some embodiments of the present disclosure.

Aspects of the present disclosure are directed to adaptive error avoidance in memory devices. A memory sub-system can be a storage device, a memory module, or a hybrid of a 7 storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a NOT-AND (NAND) memory device. Other examples of non-volatile memory devices are described below in conjunction with FIG. 1. A non-volatile memory device is a package of one or more dies. Each die can include two or more planes, such that each plane carries a matrix of memory cells formed onto a silicon wafer and joined by conductors referred to as wordlines and bitlines, such that a wordline joins multiple memory cells forming a row of the matric of memory cells, while a bitline joins multiple memory cells forming a column of the matric of memory cells. For some types of non-volatile memory devices (e.g., NAND devices), each plane consists of a set of physical blocks. A "block" herein refers to a set of contiguous or non-contiguous memory pages. An example of a block is an erasable block, which is a minimal erasable unit of memory, while a page is a minimal writable unit of memory. Each page includes a set of memory cells ("cells"). A cell is an electronic circuit that stores information. Depending on the cell type, each memory cell can store one or more bits of binary information, and has various logic states that correlate to the number of bits being stored. The logic states can be represented by binary values, such as "0" and "1", or combinations of such values. A set of memory cells referred to as a memory page can be programmed together in a single operation, e.g., by selecting consecutive bitlines.

The memory sub-system can perform host-initiated memory access operations. For example, the host system can initiate a data operation (e.g., write, read, erase, etc.) on a memory sub-system. The host system can send access requests (e.g., write command or read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^s$ different threshold voltage levels is capable of storing n bits of information. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss (SCL), the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

A memory sub-system can mitigate the temporal voltage shift by employing block family based error avoidance strategies. The temporal voltage shift is selectively tracked for programmed blocks grouped by block families, and appropriate voltage offsets, which are based on block affiliation with a certain block family, are applied to the base read levels in order to perform read operations. "Block family" herein shall refer to a set of blocks that have been programmed within a specified time window and a specified temperature window. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels may be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process (also referred to as a calibration scan) in order to evaluate a data state metric (e.g., a bit error rate) and associate each block family with one of predefined time after programming (TAP) bins, which is in turn associated with the voltage offset to be applied for read operations. The bins can be numbered from 0 to 7 (e.g., bin 0-bin 7), and each bin can be associated with a voltage offset to be applied to a base read level for read operations. The associations of block families with TAP bins (e.g., bins 0-7) can be stored in respective metadata tables maintained by the memory sub-system controller.

Due to the memory cell formation process variations the sizes (e.g., diameters) of memory cells located in certain portions of a die (e.g., at specific wordlines) may be larger than sizes of other memory cells addressable by the same bitline, thereby resulting in wordline-to-wordline variations. As a result, larger memory cells tend to have a smaller effective electric field than smaller memory cells. Uniformly applying wordline voltages despite variations of the effective fields of each memory cell of a wordline may result in different Vt distribution across various wordlines. In particular, Vt distribution has a strong dependence wordlines due to the wordline-to-wordline variations. As a result, due to the wordline-to-wordline variation caused by the formation process, sets of memory cells addressable by individual wordlines may experience even more temporal voltage shift caused by the slow charge loss in comparison to other wordlines resulting in even more increased bit error rate in read operations.

A memory sub-system can mitigate the temporal voltage shift by employing the block family-based error avoidance strategy, which involves selectively tracking the temporal voltage shift for programmed blocks grouped by block families, and applying and appropriate voltage offsets, which are based on block affiliation with a certain block family, to the base read levels in order to perform read operations. A "block family" herein shall refer to a set of blocks that have been programmed within a specified time window and a specified temperature window. Since the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. The "base read level" herein shall refer to the initial threshold voltage level exhibited by the memory cell immediately after programming. In some implementations, the base read levels may be stored in the metadata of the memory device. However, since a chosen voltage offset is uniformly applied to all wordlines of a block based on the blocks affiliation with a certain block family, the larger temporal voltage shifts experienced by some wordlines of the block may not be fully mitigated.

Aspects of the present disclosure address the above-noted and other deficiencies by implementing an adaptive block error avoidance (BFEA) strategy, which applies a combination of the default BFEA voltage offset and a sub-BFEA voltage offset for sets of memory cells (e.g., pages) that satisfy a predefined criterion.

The default threshold voltage offset value can be determined by identifying the block family to which the set of memory cells ia assigned and retrieving, from a default BFEA table, a record that maps the TAP bin associated with the block family to a set of default voltage offset levels corresponding to respective logical programming levels (e.g., L0 to L7 for triple-level cells (TLC)). "Logical programming level" herein shall refer to the binary value (e.g., "000", "001", . . . "111" for TLC) stored by a chosen memory cell; the binary value can be inferred from the measured threshold voltage level of the chosen memory cell.

The default BFEA table reflects the aggregated temporal voltage shift for all wordlines of the memory device, and thus fails to account for deviations from the aggregated temporal voltage shift that may be exhibited by sets of memory cells (e.g., pages) addressable by certain outlier wordlines.

In order to compensate for such deviations, a set of sub-BFEA tables may be employed, such that each sub-BFEA table is associated with a respective wordline group. Similar to the default BFEA table, a sub-BFEA table may include multiple records, such that each record maps a corresponding TAP bin to a respective set of default voltage offset levels corresponding to respective logical program-ming levels. Each sub-BFEA table, which corresponds to a certain wordline group, may be constructed to compensate for the temporal voltage shift of the worst wordline of that wordline group (i.e., the wordline having the largest, among all wordlines of the wordline group, temporal voltage shift at a predetermined logical programming level (e.g., L7).

In some implementations, the criterion for applying the above-described sub-BFEA technique is satisfied if the ratio of the value of a chosen data state metric to the aggregate value of the data state metric exhibited by a predetermined number of previously performed read operations exceeds a configurable ratio threshold value, which may be utilized to adjust the level of sensitivity for applying the sub-BFEA technique. In some implementations, the criterion further requires that the data state metric exceed a configurable data state metric threshold value, which may be chosen to prevent over-utilization of resources of the memory device in per-forming error handling by a decoder of the memory device. The data state metric may be represented, e.g., by the aggregated raw bit error rate (RBER) exhibited by a pre-defined number read operations that have been previously performed respect to the set of memory cells.

In some implementations, a list of wordlines may be maintained to track the status of each wordline enabled for adaptive BFEA strategy, which can be queried for determin-ing whether the sub-BFEA technique should be applied to the set of memory cells addressable by a given wordline. A wordline can be removed from the list of wordlines upon performing a media management operation (e.g., a folding operation) on the set of memory cells addressable by the wordline.

Thus, advantages of the present disclosure include, but are not limited to, improving the performance of read operations by providing more accurate voltage offset values to be applied for performing read operations to compensate for the wordline-to-wordline variations in the temporal voltage shift.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some implementations, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connec-tions such as electrical, optical, magnetic, etc.

The host system 120 can include a processor chipset and a software stack executed by the processor chipset. The processor chipset can include one or more cores, one or more caches, a memory controller (e.g., NVDIMM control-ler), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a periph-eral component interconnect express (PCIe) interface, uni-versal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combina-tion of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-Hridded data access array. Addition-ally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells, such as memory array 137. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some implementations, each of the memory devices 130 can include one or more arrays of memory cells such as SLCs, MLCs, TLCs, QLCs, or any combination of such. In some implementations, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some implementations, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some implementations, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some implementations, the memory devices 130 include local media controller 132 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some implementations, a memory device 130 is a managed memory device, which is a raw memory device combined with a local controller (e.g., local controller 132) for media management within the same memory device package. An example of a managed memory device is a managed NAND (MNAND) device.

The memory sub-system 110 includes memory access manager 113 that may enable and apply an adaptive BFEA strategy. In some implementations, the memory sub-system controller 115 includes at least a portion of the memory access manager 113. In some implementations, the memory access manager 113 is part of the host system 110, an application, or an operating system. In other embodiments, local media controller 135 includes at least a portion of the memory access manager 113 and is configured to perform the functionality described herein.

The memory access manager 113 may store a default BFEA table and a plurality of sub-BFEA tables in the local memory 119 of the memory sub-system controller 115. Each sub-BFEA table corresponds to a wordline group of the memory device 130 and/or 140. As previously described, the memory device 130 and/or 140 may include a plurality of wordline groups. Each wordline group includes a non-overlapping subset of all wordlines of the memory device 130 and/or 140. In some implementations, all subsets all wordlines of the memory device 130 and/or 140 include an equal number of wordlines.

The default BFEA table may include multiple entries, such that each entry corresponds to one of the set of logical programming levels (e.g., logical programming levels 1-7 or L1-7). Each entry includes a default threshold voltage offset value for each TAP bin of the chosen set of TAP bins. Accordingly, to obtain a plurality of default threshold voltage offset values corresponding to the logical programming level for a specific TAP bin, each entry is read at the specified TAP bin.

As noted herein above, the default BFEA table reflects the aggregated temporal voltage shift for all wordlines of the memory device, and thus fails to account for deviations from the aggregated temporal voltage shift that may be exhibited by sets of memory cells (e.g., pages) addressable by certain outlier wordlines.

In order to compensate for such deviations, a set of sub-BFEA tables may be employed, such that each sub-BFEA table is associated with a respective wordline group. Similar to the default BFEA table, a sub-BFEA table may include multiple records, such that each record maps a corresponding TAP bin to a respective set of default voltage offset levels corresponding to respective logical programming levels.

In an illustrative example, responsive to receiving a request to perform a read operation with respect to a set of memory cells of a memory device, the memory access manager 113 may identify (e.g., using a metadata table mapping blocks of the memory device to respective block families) the block family associated with the set of memory cells. Upon identifying the block family, the memory access manager 113 may determine, for each logical programming level of a plurality of logical programming levels, a corresponding default block family error avoidance (BFEA) threshold voltage offset value to be applied for performing read operations with respect to the pages associated with the block family.

The memory access manager 113 may then determine whether the sub-BFEA technique should be applied to the set of memory cells. In some implementations, the memory access manager 113 may determine whether the wordline addressing the memory cells is found on the list of sub-BFEA wordlines. Alternatively, the memory access manager 113 may apply a predefined sub-BFEA criterion to a value of a chosen data state metric that has been exhibited by the set of memory cells in previously performed memory access operations. The data state metric may be represented, e.g., by the aggregated raw bit error rate (RBER) exhibited by a predefined number read operations that have been previously performed respect to the set of memory cells.

In some implementations, the sub-BFEA criterion for applying the above-described sub-BFEA technique is satisfied if the ratio of the value of a chosen data state metric to the aggregate value of the data state metric exhibited by a predetermined number of previously performed read operations exceeds a configurable ratio threshold value, which may be utilized to adjust the level of sensitivity for applying the sub-BFEA technique. In some implementations, the criterion further requires that the data state metric exceed a configurable data state metric threshold value, which may be chosen to prevent over-utilization of resources of the memory device in performing error handling by a decoder of the memory device.

Responsive to determining that the wordline addressing the set of memory cells is found on the list of sub-BFEA wordlines and/or that the value of the chosen data state metric exhibited by the set of memory cells satisfies the sub-BFEA criterion, the memory access manager 113 may apply the sub-BFEA technique to the read operations performed on the set of memory cells. In particular, the memory access manager 113 may identify the TAP bin associated with the block family, and then, for each logical programming level, determine a corresponding sub-BFEA threshold voltage offset value associated with the identified TAP. The memory access manager 113 may perform the requested memory access operation by applying, for each logical programming level, the sum of the default BFEA threshold voltage value, the sub-BFEA threshold voltage value, and the corresponding base voltage level.

In some implementations, responsive to determining that the sub-BFEA technique is applicable to the set of memory cells, the memory access manager 113 may append the wordline addressing the set of memory cells to a list of sub-BFEA wordlines.

Conversely, should the memory access manager 113 determine that the sub-BFEA technique is not applicable to the set of memory cells, the requested memory access operation may be performed by applying, for each logical programming level, the sum of the default BFEA threshold voltage value and the corresponding base voltage level.

Further details regarding the operations of the memory access manager 113 are described below.

FIG. 2 depicts an example graph 200 illustrating the dependency of the threshold voltage offset 210 on the time after program 220 (i.e., the period of time elapsed since the block had been programmed. As schematically illustrated by FIG. 2, blocks of the memory device are grouped into block families 230A-230N, such that each block family includes one or more blocks that have been programmed within a specified time window and a specified temperature window. As noted herein above, since the time elapsed after programming and temperature are the main factors affecting the temporal voltage shift, all blocks and/or partitions within a single block family 210 are presumed to exhibit similar distributions of threshold voltages in memory cells, and thus would require the same voltage offsets for read operations.

Block families can be created asynchronously with respect to block programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with bin 0. Then, the memory sub-system controller can periodically perform a calibration process in order to associate each die of every block family with one of the predefined TAP bins (bins 0-7 in the illustrative example of FIG. 2), which is in turn associated with the voltage offset to be applied for read operations. The associations of blocks with block families and block families and dies with TAP bins can be stored in respective metadata tables maintained by the memory sub-system controller.

Figure 3:
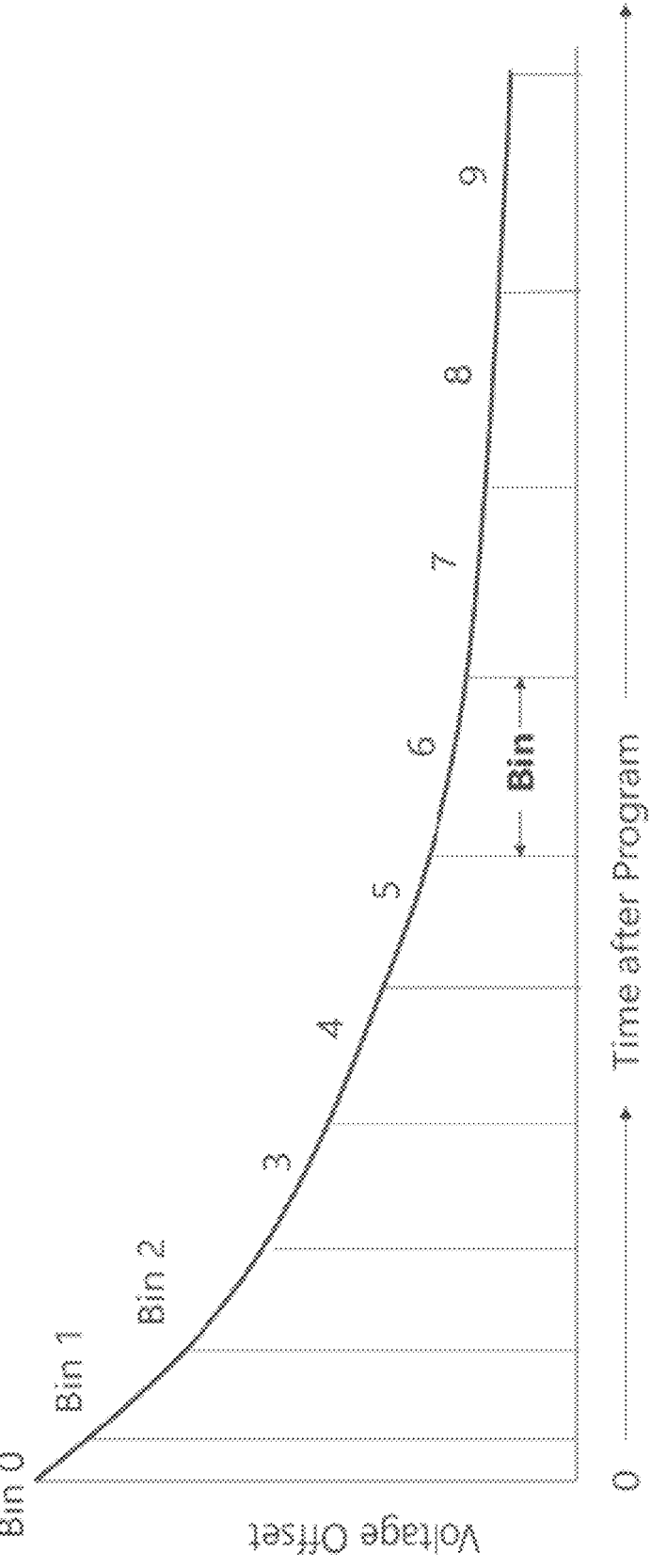
FIG. 3 schematically illustrates a set of predefined time-after-programming (TAP) bins, in accordance with embodiments of the present disclosure.

FIG. 3 schematically illustrates a set of predefined TAP bins (bin 0 to bin 9), in accordance with embodiments of the present disclosure. As schematically illustrated by FIG. 3, the threshold voltage offset graph can be subdivided into multiple TAP bins, such that each bin corresponds to a predetermined range of threshold voltage offsets. While the illustrative example of FIG. 4 defines ten bins, in other implementations, various other numbers of bins can be employed (e.g., 64 bins). Based on a periodically performed calibration process, the memory sub-system controller associates each die of every block family with a TAP bin, which defines a set of threshold voltage offsets to be applied to the base voltage read level in order to perform read operations, as described in more detail herein below.

Figure 4:
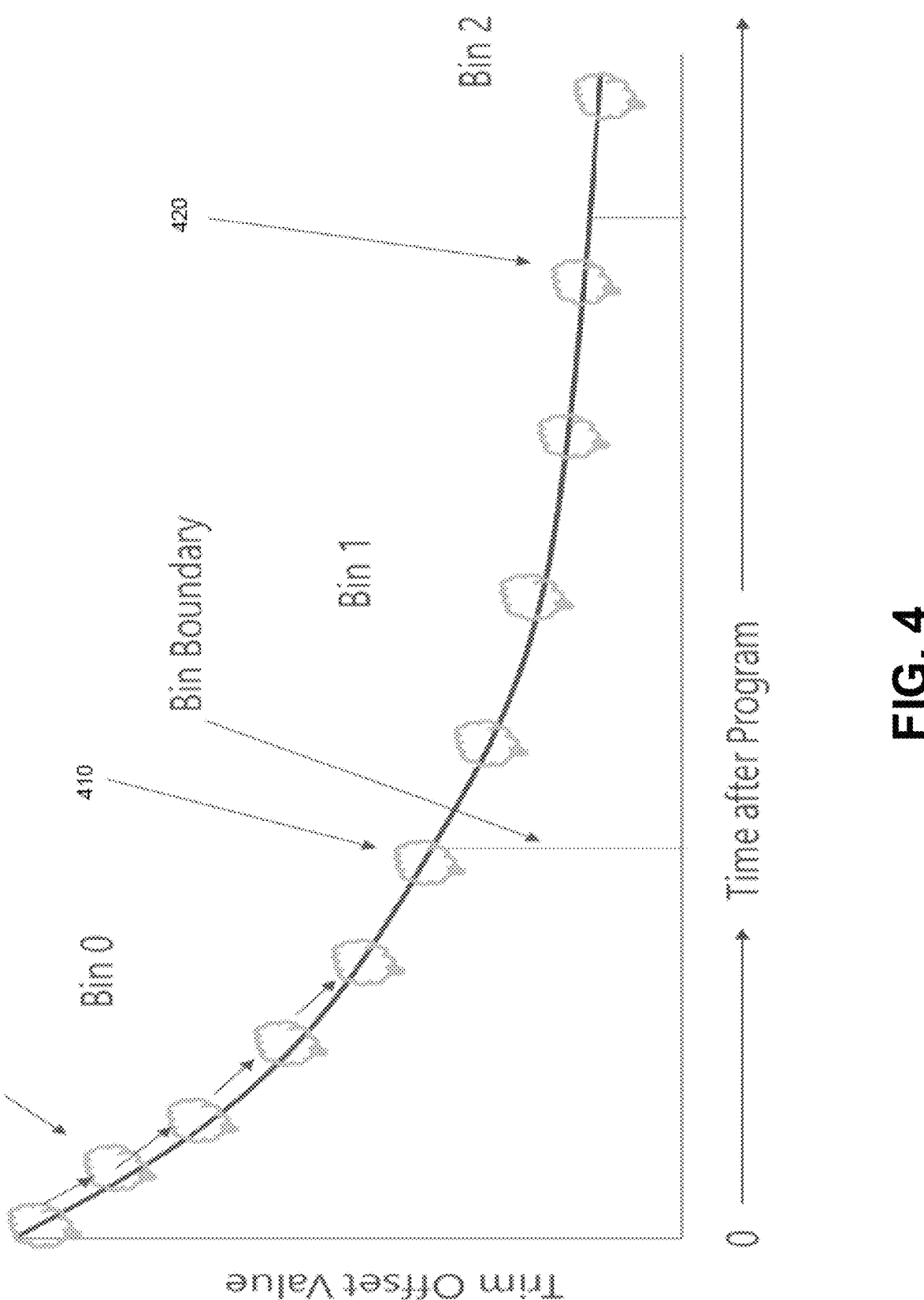
FIG. 4 schematically illustrates selecting block families for calibration, in accordance with embodiments of the present disclosure.

FIG. 4 schematically illustrates selecting block families for calibration, in accordance with embodiments of the present disclosure. As schematically illustrated by FIG. 4, the memory sub-system controller can limit the calibration operations to the oldest block family in each bin (e.g., block family 410 in bin 0 and block family 420 in bin 1), since it is the oldest block family that will, due to the slow charge loss, migrate to the next bin before any other block family of the current bin.

Figures 5A, 5B:
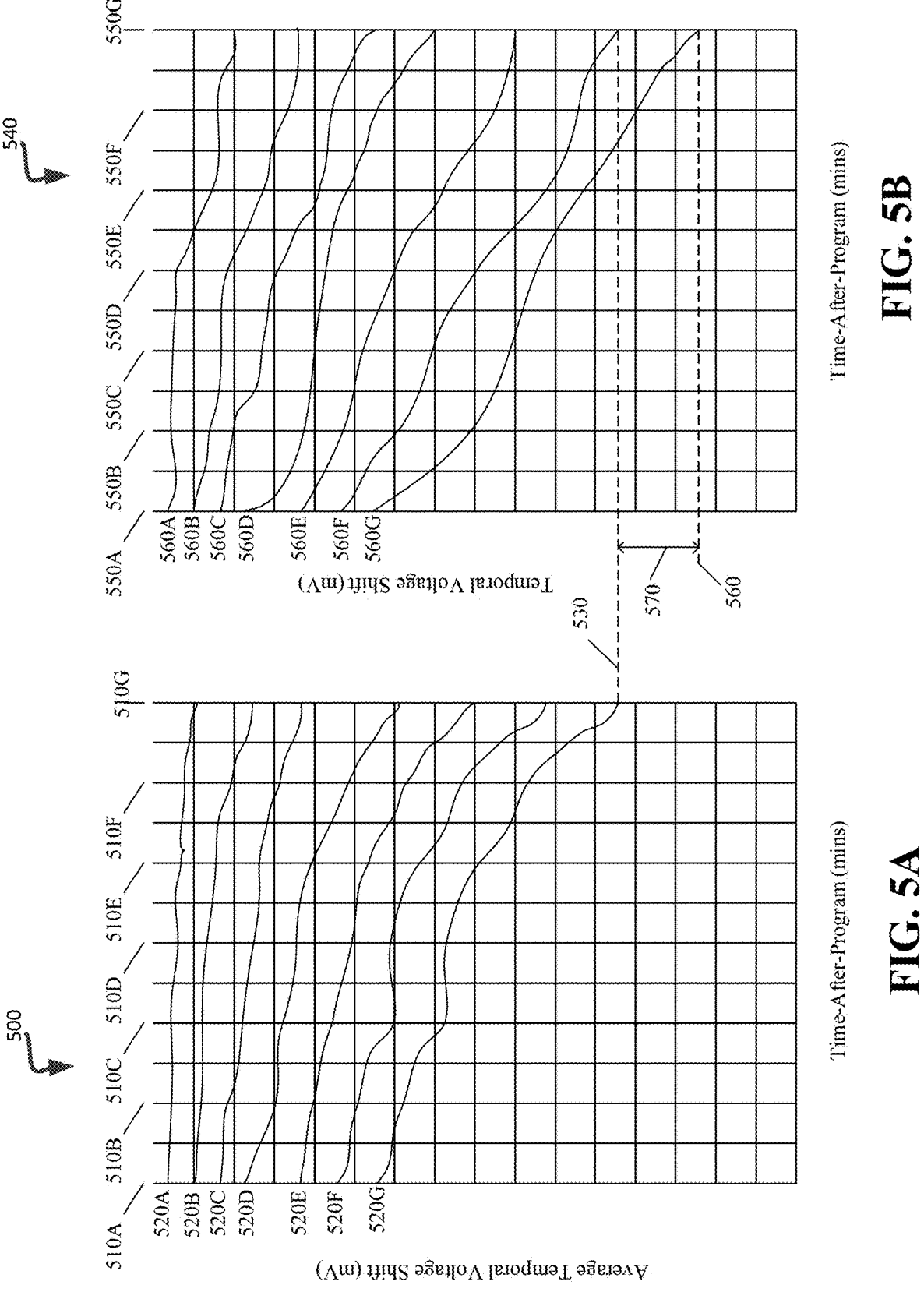
FIG. 5A is a graphical illustration of an average temporal voltage shifts for each threshold voltage level of all wordlines, in accordance with embodiments of the present disclosure.
FIG. 5B is a graphical illustration of a temporal voltage shifts for each threshold voltage level of a wordline of a wordline group, in accordance with embodiments of the present disclosure.

FIG. 5A depicts an example graph 500 illustrates average temporal voltage shifts for each threshold voltage level of all wordlines of the memory device 130 and/or 140 of FIG. 1. As schematically illustrated by FIG. 5A, an average temporal voltage shift for each threshold voltage level (e.g., 520A-520G) is provided for a period of time (e.g., set time-after-program). For example, threshold voltage level 520A refers to threshold voltage level 1, threshold voltage level 520B refers to threshold voltage level 2, threshold voltage level 520C refers to threshold voltage level 3, threshold voltage level 520D refers to threshold voltage level 4, threshold voltage level 520E refers to threshold voltage level 5, threshold voltage level 520F refers to threshold voltage level 6, and threshold voltage level 520G refers to threshold voltage level 7. As previously described, the average temporal voltage shift for each threshold voltage level (e.g., 520A-520G) is determined by aggregating (e.g., averaging) the temporal voltage shift of all the wordlines for each threshold voltage level. Each predetermined time-after-program value (e.g., 510A-510G) corresponds to a TAP bin of a plurality of TAP bins. For example, predetermined time-after-program value 510A corresponds to TAP bin 1, predetermined time-after-program value 510B corresponds to TAP bin 2, predetermined time-after-program value 510C corresponds to TAP bin 3, predetermined time-after-program value 510D corresponds to TAP bin 4, predetermined time-after-program value 510E corresponds to TAP bin 5, predetermined time-after-program value 510F corresponds to TAP bin 6, and predetermined time-after-program value 510G corresponds to TAP bin 7.

Accordingly, each entry of a default BFEA table (e.g., table 610 of FIG. 6A) corresponds to a threshold voltage level (e.g., 520A-520G). For each entry (associated with a threshold voltage level), a default threshold voltage offset is stored at each predetermined time-after-program value (associated with a bin) based on the average temporal voltage shift at the respective predetermined time-after-program value (associated with the respective bin).

FIG. 5B depicts an example graph 540 illustrate temporal voltage shifts for each threshold voltage level of a wordline of a wordline group of a plurality of wordline groups of the memory device 130 and/or 140 of FIG. 1. having the largest temporal voltage shift. As schematically illustrated by FIG. 5B, a temporal voltage shift for each threshold voltage level (e.g., 560A-560G) (similar to threshold voltage level 520A-H of FIG. 5A, respectively) is provided for a period of time (e.g., set time-after-program) having a plurality of predetermined time-after program values (e.g., 550A-550G) (similar to the predetermined time-after program values 510A-510G of FIG. 5A, respectively).

Similarly to FIG. 5A, for example, predetermined time-after-program value 550A corresponds to TAP bin 1, predetermined time-after-program value 550B corresponds to TAP bin 2, predetermined time-after-program value 550C corresponds to TAP bin 3, predetermined time-after-program value 550D corresponds to TAP bin 4, predetermined time-after-program value 550E corresponds to TAP bin 5, predetermined time-after-program value 550F corresponds to TAP bin 6, and predetermined time-after-program value 550G corresponds to TAP bin 7. Additionally, for example, threshold voltage level 560A refers to threshold voltage level 1, threshold voltage level 560B refers to threshold voltage level 2, threshold voltage level 560C refers to threshold voltage level 3, threshold voltage level 560D refers to threshold voltage level 4, threshold voltage level 560E refers to threshold voltage level 5, threshold voltage level 560F refers to threshold voltage level 6, and threshold voltage level 560G refers to threshold voltage level 7.

As previously described, the wordline of the wordline group having the largest temporal voltage shift is determined by identifying the wordline that has the greatest difference (570) between (i) an average temporal voltage shift (e.g., 530 of FIG. 5A) at a predetermined threshold voltage level (e.g., 520G of FIG. 5A) and a predetermined time-after-program (e.g., 510G of FIG. 5A) and (ii) a temporal voltage shift (e.g., 560 of FIG. 5B) at the predetermined threshold voltage level (e.g., 560G of FIG. 5B) and the predetermined time-after-program (e.g., 550G of FIG. 5B) among the other wordlines of the wordline group.

Accordingly, based on the graph 540 representing the temporal voltage shift of each threshold voltage level (e.g., 560A-560H) for the period of time (e.g., set time-after-program value), each entry of a sub-BFEA table (e.g., table 650 of FIG. 6B) associated with the wordline group corresponds to a threshold voltage level (e.g., 560A-560G). For each entry (associated with a threshold voltage level), a wordline group voltage offset is stored at each predetermined time-after-program value (associated with a bin) based on a difference between (i) the average temporal voltage shift at the respective predetermined time-after-program value (associated with the respective bin) and (ii) the temporal voltage shift at the respective predetermined time-after-program value (associated with the respective bin).

FIG. 6A schematically illustrates a default BFEA table maintained by the memory sub-system controller for adaptive BFEA management, in accordance with embodiments of the present disclosure. As schematically illustrated by FIG. 6A, the memory sub-system controller can maintain the default BFEA table 610. Each record (or entry) of the default BFEA table 610 specifies a threshold voltage level of the plurality of threshold voltage levels 620A-H that corresponds to one of the threshold voltage levels 510A-510G of FIG. 5A. Accordingly, as previously described, each record of the BFEA table 610 stores a default threshold voltage offset at each predetermined time-after-program value (e.g., 510A-510G of FIG. 5A) associated with a TAP bin (TAP bin 1-7, respectively).

For example, for the record associated with threshold voltage level 620A which is associated with threshold read level 520A of FIG. 5A, the average temporal voltage shift of threshold voltage level 520A at time-after-program 510A of FIG. 5A is stored in bin 1 of the record associated with threshold voltage level 620A, the average temporal voltage shift of threshold voltage level 520A at time-after-program 510B of FIG. 5A is stored in bin 2 of the record associated with threshold voltage level 620A, and so on. Accordingly, as previously described, to obtain a plurality of default threshold voltage offsets for a TAP bin to be applied to the base read levels, each record of the default BFEA table 610 is read at the TAP bin.

FIG. 6B schematically illustrates a sub-BFEA table of a plurality of sub-BFEA tables maintained by the memory sub-system controller for adaptive BFEA management, in accordance with embodiments of the present disclosure. As schematically illustrated by FIG. 6B, the memory sub-system controller can maintain the plurality of sub-BFEA tables each associated with a wordline group of a plurality of wordline groups (e.g., sub-BFEA table 650).

Each record of the sub-BFEA table 650 specifies a threshold voltage level of the plurality of threshold voltage levels 660A-H that corresponds to one of the threshold voltage levels 560A-560G of FIG. 5B. Accordingly, as previously described, each record of the BFEA table 650 stores a wordline group threshold voltage offset at each predetermined time-after-program value (e.g., 550A-550G of FIG. 5B) associated with a TAP bin (TAP bin 1-7, respectively) based on a difference between (i) the average temporal voltage shift at the respective predetermined time-after-program value and (ii) the temporal voltage shift at the respective predetermined time-after-program value.

For example, for the record associated with threshold voltage level 660A which is associated with threshold read level 560A of FIG. 5B, the difference of the average temporal voltage shift of the threshold voltage level 520A of FIG. 5A at time-after program 510A of FIG. 5A and the temporal voltage shift of the threshold voltage level 560A of FIG. 5B at time-after-program 550A of FIG. 5B is stored in bin 1 of the record associated with threshold voltage level 660A of FIG. 6B, the difference of the average temporal voltage shift of the threshold voltage level 520A of FIG. 5A at time-after program 510B of FIG. 5A and the temporal voltage shift of the threshold voltage level 560A of FIG. 5B at time-after-program 550B of FIG. 5B is stored in bin 2 of the record associated with threshold voltage level 660A of FIG. 6B, and so on. Accordingly, as previously described, to obtain a plurality of wordline group threshold voltage offsets for a TAP bin to be applied to the base read levels, each record of the sub-BFEA table 650 is read at the TAP bin.

In operation, as previously described, if the adaptive BFEA strategy is enabled for a wordline, the appropriate sub-BFEA table is identified by determining whether an index and.or identification of the wordline matching an index and/or identification of a wordline within the wordline group among the plurality of wordline groups. The sub-BFEA table associated with wordline group including the matching wordline is selected (e.g., sub-BFEA table 650). Once the sub-BFEA table is identified (e.g., selected), a TAP bin the block family containing the block in which the wordline is assigned is used to query the default BFEA table 610 and the sub-BFEA table 650. Querying the default BFEA table 610 obtains a default threshold voltage offset. Querying the sub-BFEA table 650 obtains a wordline group threshold voltage offset for each threshold voltage level to be applied to a base read voltage level of the corresponding threshold voltage level. In particular, the sum of the default threshold voltage offset and the wordline group threshold voltage offset for each threshold voltage level is applied (e.g., added) to a base read voltage level of the corresponding threshold voltage level to mitigate against the temporal voltage shift.

Figure 7:
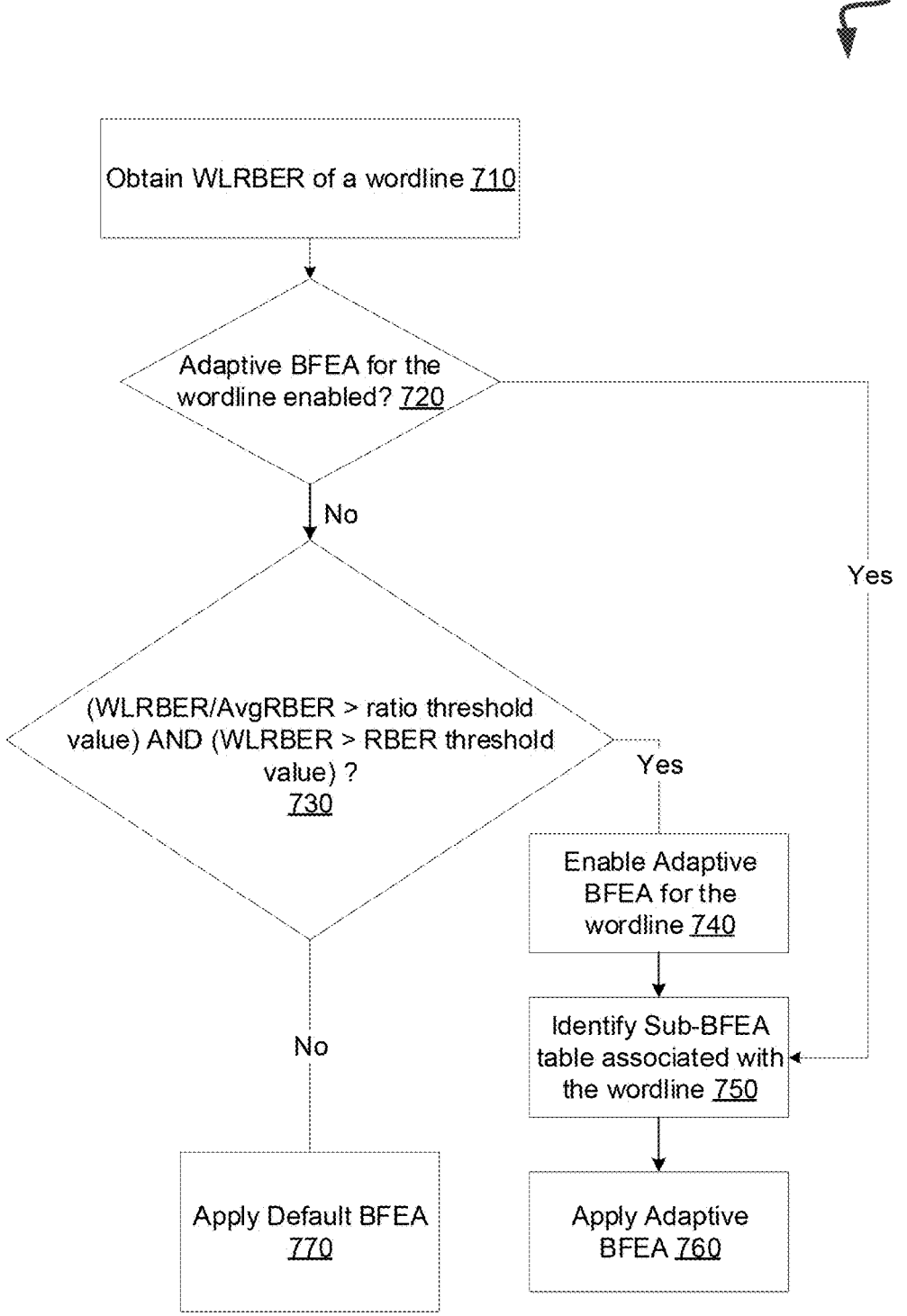
FIG. 7 a flow diagram of an example method of performing a memory access operation on a memory device using adaptive block family-based error avoidance, in accordance with some embodiments of the present disclosure.

FIG. 7 is a flow diagram of an example method 700 of performing a memory access operation on a memory device using adaptive block family-based error avoidance, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 700 is performed by memory access manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic obtains a WLRBER of a wordline of a memory device. The WLRBER is a raw bit error rate associated with a read operation performed on the wordline (e.g., wordline).

At operation 720, the processing logic determines whether adaptive BFEA strategy for the wordline is enabled. As previously described, a list (or table) of wordlines that have adaptive BFEA strategy enabled may be maintained by the memory sub-system controller of the memory device. In some instances, responsive to determining that the adaptive BFEA strategy for the wordline may be enabled, the processing logic proceed to operation 750.

Responsive to determining that the adaptive BFEA strategy for the wordline is not enabled, at operation 730, the processing logic determines whether the WLRBER satisfies the threshold criterion. As previously described, the threshold criterion may be satisfied if: (i) the WLRBER divided by AvgRBER (e.g., an average data state metric associated with a predetermined number of previous read operations (e.g., 10 previous read operations)) exceeds a configurable ratio threshold value and (ii) WLRBER exceeds a RBER threshold value (e.g., a configurable data state metric threshold value). The configurable ratio threshold value may be a value (e.g., between 1 and 10) to tailor the level of sensitivity in enabling the adaptive BFEA strategy. The RBER threshold value may be a value associated with a point in which a decoder of the memory device utilizes an excessive amount of resources to handle an error.

Responsive to satisfying the threshold criterion, at operation 740, the processing logic enables adaptive BFEA strategy for the wordline. As previously described, In some implementations, responsive to enabling the adaptive BFEA strategy for the wordline, the wordline may be added to the list (or table) of wordlines that have adaptive BFEA strategy enabled.

At operation 750, the processing logic identifies a sub-BFEA table associated with the wordline. As previously described, each wordline of the plurality of wordlines are associated with a wordline group. Each wordline group may be associated with a sub-BFEA table. Accordingly, based on the wordline identification, the processing logic may identify a wordline group associated with the wordline and a corresponding sub-BFEA table.

At operation 760, the processing logic applies the adaptive BFEA strategy. As previously described, to apply the adaptive BFEA strategy, the processing logic identifies a TAP bin associated with the wordline based on the wordline's association with a block and subsequently the blocks association with a block family. Accordingly, the processing logic based on the block family's assignment to a bin, an identifier of the TAP bin may be used to obtain a default threshold voltage offset value from the default BFEA table for each threshold voltage level at the identifier of the TAP bin and a wordline group threshold voltage offset value from the sub-BFEA table for each threshold voltage at the identifier of the TAP bin. Each default threshold voltage offset value and wordline group threshold voltage offset value at each threshold voltage level may be added to obtain a voltage offset at each threshold voltage level. The voltage offset at each threshold voltage level may be applied to the read level voltage at each threshold voltage level.

Responsive to satisfying the threshold criterion, at operation 770, the processing logic applies the default BFEA strategy. As previously described, to apply the adaptive BFEA strategy, the processing logic identifies a TAP bin associated with the wordline based on the wordline's association with a block and subsequently the blocks association with a block family. Accordingly, the processing logic based on the block family's assignment to a bin, an identifier of the TAP bin may be used to obtain a default threshold voltage offset value from the default BFEA table for each threshold voltage level at the identifier of the TAP bin. Accordingly, a default threshold voltage offset value at each threshold voltage level may be applied to the read level voltage at each threshold voltage level.

FIG. 8 a flow diagram of an example method 800 of performing a memory access operation on a memory device using adaptive block family-based error avoidance, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 800 is performed by memory access manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, the processing device implementing the method receives a request to perform a memory access operation (e.g., a read operation) with respect to a set of memory cells connected to a wordline of a memory device, as described in more detail herein above.

At operation 820, the processing device identifies a block family associated with the set of memory cells, as described in more detail herein above.

At operation 830, the processing device determines, for each logical programming level of a plurality of logical programming levels, a corresponding default block family error avoidance (BFEA) threshold voltage offset value associated with the block family. In an illustrative example, the BFEA threshold voltage offset value is determined using a metadata structure comprising a plurality of records, each record of the plurality of records specifying, for each TAP bin of a plurality of TAP bins, a corresponding BFEA threshold voltage offset value to be applied at a predetermined logical programming level, as described in more detail herein above.

At operation 840, the processing device determines a value of a data state metric associated with the set of memory cells, as described in more detail herein above.

Rresponsive to determining, at operation 850, that the value of the data state metric satisfies a threshold criterion, the processing continues at operation 860; otherwise, the method brances to operation 880, which involves performing the memory access operation by applying, for each logical programming level of the plurality of logical programming levels, a combination of the default BFEA threshold voltage value and a corresponding base voltage level. "Base voltage level" refers to the default read voltage level for the memory device, as described in more detail herein above. Upon performing the operation 880, the method terminates.

At operation 860, the processing device determines, for each logical programming level of a plurality of logical programming levels, a sub-BFEA threshold voltage offset value associated with a time-after-programming (TAP) bin associated with the block family. In an illustrative example, the sub-BFEA threshold voltage offset value is determined using a metadata structure comprising a plurality of records, each record of the plurality of records specifying, for each TAP bin of a plurality of TAP bins, a corresponding sub-BFEA threshold voltage offset value to be applied at a predetermined logical programming level, as described in more detail herein above.

At operation 870, the processing device performs the memory access operation by applying, for each logical programming level of the plurality of logical programming levels, a combination of the default BFEA threshold voltage value, the sub-BFEA threshold voltage value, and a corresponding base voltage level, as described in more detail herein above. Upon performing the operation 870, the method terminates.

Figure 9:
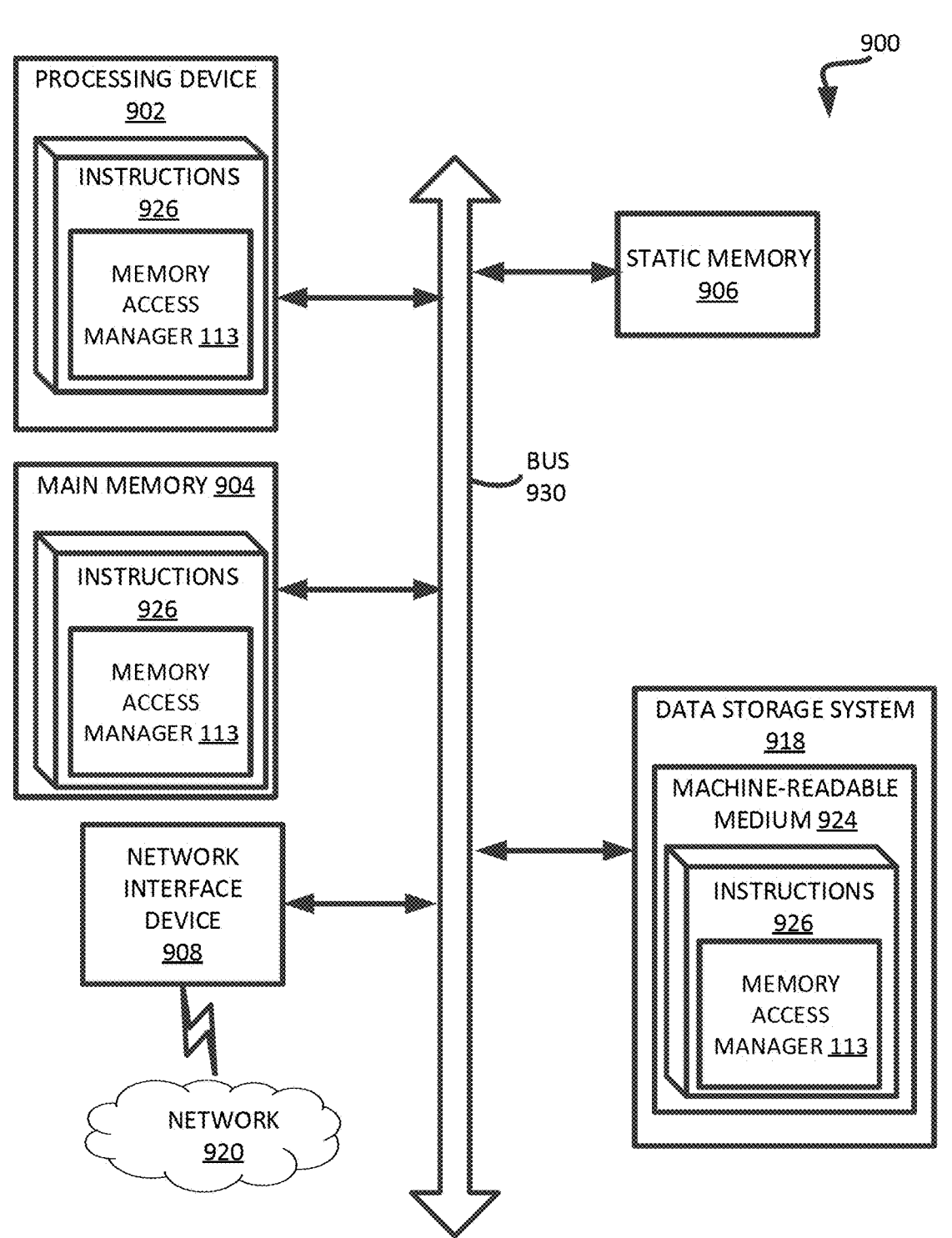
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some implementations, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the die family management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to die family management component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

receiving, by a processing device, a request to perform a memory access operation with respect to a set of memory cells connected to a wordline of a memory device;

obtaining a plurality of default block family error avoidance (BFEA) threshold voltage offset values to be applied to a plurality of logical programming levels;

obtaining, based on a value of a data state metric associated with the set of memory cells, a plurality of sub-BFEA threshold voltage offset values to be applied to the plurality of logical programming levels; and for each logical programming level of the plurality of logical programming levels, applying, by the memory access operation, a combination of a default BFEA threshold voltage value associated with a respective logical programming level, a sub-BFEA threshold voltage value associated with the respective logical programming level, and a base voltage level associated with the respective logical programming level.

2. The method of claim 1, wherein obtaining, based on the value of the data state metric associated with the set of memory cells, the plurality of sub-BFEA threshold voltage offset values to be applied to the plurality of logical programming levels comprises:

determining whether the value of the data state metric satisfies a threshold criterion; and responsive to determining that the value of the data state metric satisfies the threshold criterion, determining, for each logical programming level of the plurality of logical programming levels, a corresponding sub-BFEA threshold voltage offset value.

3. The method of claim 2, wherein the threshold criterion specifies a threshold ratio of the value of data state metric to an aggregate historic value of the data state metric.

4. The method of claim 2, wherein the threshold criterion specifies a threshold value of the data state metric.

5. The method of claim 1, wherein the data state metric is represented by a raw bit error rate (RBER).

6. The method of claim 1, wherein the sub-BFEA threshold voltage offset value is determined using a metadata structure comprising a plurality of records, each record of the plurality of records specifying, for each TAP bin of a plurality of TAP bins, a corresponding sub-BFEA threshold voltage offset value to be applied at a predetermined logical programming level.

7. The method of claim 1, wherein the BFEA threshold voltage offset value is determined using a metadata structure comprising a plurality of records, each record of the plurality of records specifying, for each TAP bin of a plurality of TAP bins, a corresponding BFEA threshold voltage offset value to be applied at a predetermined logical programming level.

8. A system comprising:

a memory device; and a processing device, operatively coupled to the memory device, the processing device to perform operations comprising:

receiving, by a processing device, a request to perform a memory access operation with respect to a set of memory cells connected to a wordline of a memory device;

obtaining a plurality of default block family error avoidance (BFEA) threshold voltage offset values to be applied to a plurality of logical programming levels;

obtaining, based on a value of a data state metric associated with the set of memory cells, a plurality of sub-BFEA threshold voltage offset values to be applied to the plurality of logical programming levels; and for each logical programming level of the plurality of logical programming levels, applying, by the memory access operation, a combination of a default BFEA threshold voltage value associated with a respective logical programming level, a sub-BFEA threshold voltage value associated with the respective logical programming level, and a base voltage level associated with the respective logical programming level.

9. The system of claim 8, wherein obtaining, based on the value of the data state metric associated with the set of memory cells, the plurality of sub-BFEA threshold voltage offset values to be applied to the plurality of logical programming levels comprises:

determining whether the value of the data state metric satisfies a threshold criterion; and responsive to determining that the value of the data state metric satisfies the threshold criterion, determining, for each logical programming level of the plurality of logical programming levels, a corresponding sub-BFEA threshold voltage offset value.

10. The system of claim 9, wherein the threshold criterion specifies a threshold ratio of the value of data state metric to an aggregate historic value of the data state metric.

11. The system of claim 9, wherein the threshold criterion specifies a threshold value of the data state metric.

12. The system of claim 8, wherein the data state metric is represented by a raw bit error rate (RBER).

13. The system of claim 8, wherein the sub-BFEA threshold voltage offset value is determined using a metadata structure comprising a plurality of records, each record of the plurality of records specifying, for each TAP bin of a plurality of TAP bins, a corresponding sub-BFEA threshold voltage offset value to be applied at a predetermined logical programming level.

14. The system of claim 8, wherein the BFEA threshold voltage offset value is determined using a metadata structure comprising a plurality of records, each record of the plurality of records specifying, for each TAP bin of a plurality of TAP bins, a corresponding BFEA threshold voltage offset value to be applied at a predetermined logical programming level.

15. A non-transitory computer-readable storage medium comprising executable instructions that, when executed by a processing device, cause the processing device to perform operations comprising:

receiving, by a processing device, a request to perform a memory access operation with respect to a set of memory cells connected to a wordline of a memory device;

obtaining a plurality of default block family error avoidance (BFEA) threshold voltage offset values to be applied to a plurality of logical programming levels;

obtaining, based on a value of a data state metric associated with the set of memory cells, a plurality of sub-BFEA threshold voltage offset values to be applied to the plurality of logical programming levels; and for each logical programming level of the plurality of logical programming levels, applying, by the memory access operation, a combination of a default BFEA threshold voltage value associated with a respective logical programming level, a sub-BFEA threshold voltage value associated with the respective logical programming level, and a base voltage level associated with the respective logical programming level.

16. The non-transitory computer-readable storage medium of claim 15, wherein obtaining, based on the value of the data state metric associated with the set of memory cells, the plurality of sub-BFEA threshold voltage offset values to be applied to the plurality of logical programming levels comprises:

determining whether the value of the data state metric satisfies a threshold criterion; and responsive to determining that the value of the data state metric satisfies the threshold criterion, determining, for each logical programming level of the plurality of logical programming levels, a corresponding sub-BFEA threshold voltage offset value.

17. The non-transitory computer-readable storage medium of claim 16, wherein the threshold criterion specifies a threshold ratio of the value of data state metric to an aggregate historic value of the data state metric.

18. The non-transitory computer-readable storage medium of claim 15, wherein the data state metric is represented by a raw bit error rate (RBER).

19. The non-transitory computer-readable storage medium of claim 15, wherein the sub-BFEA threshold voltage offset value is determined using a metadata structure comprising a plurality of records, each record of the plurality of records specifying, for each TAP bin of a plurality of TAP bins, a corresponding sub-BFEA threshold voltage offset value to be applied at a predetermined logical programming level.

20. The non-transitory computer-readable storage medium of claim 15, wherein the BFEA threshold voltage offset value is determined using a metadata structure comprising a plurality of records, each record of the plurality of records specifying, for each TAP bin of a plurality of TAP bins, a corresponding BFEA threshold voltage offset value to be applied at a predetermined logical programming level.

\* \* \* \* \*